US010455662B2

(12) United States Patent
Griffoni et al.

(10) Patent No.: US 10,455,662 B2
(45) Date of Patent: Oct. 22, 2019

(54) LIGHTING SYSTEM INCLUDING A PROTECTION CIRCUIT, AND CORRESPONDING METHOD FOR PROTECTING LIGHT SOURCES FROM ELECTROSTATIC DISCHARGES

(71) Applicant: Osram GmbH, Munich (DE)

(72) Inventors: Alessio Griffoni, Venice (IT); Lorenzo Baldo, Treviso (IT)

(73) Assignee: OSRAM GMBH, Munich (DE)

( * ) Notice: Subject to any disclaimer, the term of this patent is extended or adjusted under 35 U.S.C. 154(b) by 682 days.

(21) Appl. No.: 15/116,228

(22) PCT Filed: Nov. 26, 2014

(86) PCT No.: PCT/IB2014/066352
§ 371 (c)(1),
(2) Date: Aug. 3, 2016

(87) PCT Pub. No.: WO2015/121716
PCT Pub. Date: Aug. 20, 2015

(65) Prior Publication Data
US 2017/0013693 A1 Jan. 12, 2017

(30) Foreign Application Priority Data

Feb. 14, 2014 (IT) .............................. TO2014A0127

(51) Int. Cl.
H05B 33/08 (2006.01)
H01L 27/02 (2006.01)
(Continued)

(52) U.S. Cl.
CPC ..... H05B 33/0887 (2013.01); H01L 27/0248 (2013.01); H02H 9/045 (2013.01);
(Continued)

(58) Field of Classification Search
CPC ......... H01L 2933/0066; H01L 27/0248; H01L 2224/49175; H01L 23/60
(Continued)

(56) References Cited

U.S. PATENT DOCUMENTS 5,982,050 A * 11/1999 Matsui ................. H02J 7/0016
307/10.7
2002/0154462 A1 10/2002 Ker et al.
(Continued)

FOREIGN PATENT DOCUMENTS

CN 1589087 A 3/2005
CN 1705121 A 12/2005
(Continued)

OTHER PUBLICATIONS

International Search Report based on application No. PCT/IB2014/066352 (4 pages) dated Mar. 6, 2015 (for reference purpose only).
(Continued)

Primary Examiner — Douglas W Owens
(74) Attorney, Agent, or Firm — Viering Jentschura & Partner MBB

(57) ABSTRACT

Various embodiments may relate to a lighting system including a string of light sources connected in series between a first terminal and a second terminal, wherein at least one electrical contact of the string of light sources is accessible. The system further includes a protection circuit that protects the light sources from an electrostatic discharge applied to the electrical contact that is accessible. In particular, the protection circuit includes at least one TVS diode or set of antiparallel diodes connected to the second terminal, and for each electrical contact a respective capacitor connected between the respective electrical contact and a TVS diode or set of antiparallel diodes, in such a way that an electrostatic event applied to an electrical contact is discharged through (Continued)

the respective capacitor and the respective TVS diode or set of antiparallel diodes towards the second terminal.

10 Claims, 6 Drawing Sheets

(51) Int. Cl.
*H02H 9/04* (2006.01)
*H01L 23/60* (2006.01)

(52) U.S. Cl.
CPC ......... *H05B 33/083* (2013.01); *H05B 33/089* (2013.01); *H05B 33/0845* (2013.01); *H01L 23/60* (2013.01); *Y02B 20/341* (2013.01)

(58) Field of Classification Search
USPC ... 361/15, 17–22, 42, 155, 156, 199, 212, 1, 361/88, 90, 91.1, 91.6
See application file for complete search history.

(56) References Cited

U.S. PATENT DOCUMENTS

| | | |
|---|---|---|
| 2005/0156186 A1 | 7/2005 | Lin et al. |
| 2005/0264968 A1 | 12/2005 | Chen |
| 2007/0069237 A1 | 3/2007 | Lin et al. |
| 2009/0242910 A1 | 10/2009 | Murofushi et al. |
| 2015/0237696 A1* | 8/2015 | Shackle ............. H05B 33/0821 315/188 |

FOREIGN PATENT DOCUMENTS

| | | |
|---|---|---|
| CN | 1941370 A | 4/2007 |
| CN | 202587471 U | 12/2012 |
| CN | 102903727 A | 1/2013 |
| TW | 486804 B | 5/2002 |
| TW | 200524131 A | 7/2005 |
| TW | 200525725 A | 8/2005 |
| WO | 2012168834 A1 | 12/2012 |

OTHER PUBLICATIONS

Chinese Office Action based on application No. 201480075377.1 (6 pages) dated Mar. 2, 2017 (for reference purpose only).

* cited by examiner

LIGHTING SYSTEM INCLUDING A PROTECTION CIRCUIT, AND CORRESPONDING METHOD FOR PROTECTING LIGHT SOURCES FROM ELECTROSTATIC DISCHARGES

RELATED APPLICATIONS

The present application is a national stage entry according to 35 U.S.C. § 371 of PCT application No.: PCT/IB2014/066352 filed on Nov. 26, 2014, which claims priority from Italian application No.: TO2014A000127 filed on Feb. 14, 2014, and is incorporated herein by reference in its entirety.

TECHNICAL FIELD

Various embodiments relates to lighting systems.

The disclosure has been developed with particular attention paid to protecting said lighting systems from electrostatic discharge (ESD).

BACKGROUND

Electronic converters for light sources comprising, for example, at least one light-emitting-diode (LED) or other solid-state lighting means, such as for example laser diodes, can supply a d.c. current at output.

FIG. 1 shows a possible lighting system comprising an electronic converter 10 and at least one lighting module 20. For instance, illustrated in FIG. 1 are two lighting modules 20a and 20b that are connected in parallel.

In general, each lighting module 20 can be incorporated with the electronic converter 10 in an integrated lighting system or can be connected through cables to the electronic converter 10.

The electronic converter 10 usually comprises a control circuit 102 and a power circuit 12 (for example, an AC/DC or DC/DC switching power supply), which receives at input a supply signal (for example, from the electric-power line) and supplies at output a d.c. current via a power output 106. This current may be stable or even vary over time, for example, in order to regulate the intensity of the light emitted by the lighting modules (the so-called "dimming" function). For instance, the control circuit 102 can set via a reference channel $I_{ref}$ of the power circuit 12 the current required by the LED module or modules 20.

In general, regulation of the intensity of light emitted by the lighting module 20 can be achieved by regulating the average current that traverses the lighting module 20, for example by setting a lower reference current $I_{ref}$, or by activating and deactivating the power output 106, for example through a pulse-width-modulation (PWM) signal.

In general, a LED module 20 can comprises a single LED or a plurality of LEDs. For instance, FIG. 2 shows an example in which the lighting module 20 comprises a LED chain (or LED string), in which a plurality of LEDs is connected in series.

Furthermore, the LEDs may also be divided on different branches connected in parallel. For instance, each module 20 could comprise a plurality of LED strings connected in parallel.

The LED strings may differ from one another for different factors, for example in relation to the number and type of LEDs, the operating temperature or other parameters such as to enable the voltage across one string to be different from the voltage across the string or strings. For this reason, the solution illustrated in FIG. 1 of connecting the strings directly together in parallel is frequently not practicable in so far as the electric power supply is distributed in an uncontrolled way over the various strings.

FIGS. 3 and 4 illustrate various solutions that may be used for ensuring a better uniformity of the distribution of the power over a number of lighting modules 20.

For instance, FIG. 3 shows an example where each lighting module 20 is supplied via an additional electronic converter 30. In particular, in the example considered three lighting modules 20a, 20b and 20c are illustrated, which are supplied via three additional current generators 30a, 30b and 30c, such as for example buck converters. For instance, these current generators 30a, 30b and 30c may be connected in parallel to the line 106, and the electronic converter 10 could set up a constant voltage on the line 106.

Instead, FIG. 4 shows an example where each lighting module 20a, 20b and 20c is connected in series to a respective current regulator 40a, 40b and 40c, such as for example a linear current regulator, and the lighting modules 20a, 20b and 20c are supplied via a common voltage. This voltage could also be regulated on the minimum value possible determined, for example, through sensors that detect the dropout voltage on the linear regulators.

Instead of the current regulators 40a, 40b and 40c also current mirrors or a transformer with a number of secondary windings may be used.

In this case, the dimming function could be performed also via the aforesaid current regulators 40a, 40b and 40c, for example:

a) by selectively activating or deactivating the respective current regulator 40a, 40b and 40c via a driving signal, such as for example a PWM signal; or b) in the case where adjustable current regulators are used, by setting the reference current of the current regulators 40a, 40b and 40c.

In general, the current generators 30a, 30b and 30b or the current regulators 40a, 40b and 40c may also be incorporated in the respective lighting modules 20a, 20b and 20c.

Furthermore, the light sources L of each branch may also be divided over a number of lighting modules that are connected in series, i.e., a plurality of lighting modules connected in series could be used instead of each lighting module 20a, 20b and 20c illustrated in FIGS. 1 to 4.

Typically the lighting modules 20 can be exchanged even by non-specialized persons, and consequently the lighting modules 20 and the converter 10 have to be protected from electrostatic discharge.

For instance, FIG. 5 shows an example of a typical protection circuit, where each lighting module 20 comprises a Zener diode DESD connected in antiparallel with the respective LED string L. In general, a respective Zener diode DESD could be provided for each LED or subset of LEDs of the string. In fact, typically, a protection diode is provided for each unit or subset of LEDs that has electrical contacts that are accessible.

The person skilled in the art will appreciate that, instead of a Zener diode, a transient-voltage-suppression (TVS) diode could also be used.

In general, such protection diodes can be provided directly inside the packages of the light sources L, or on the printed circuit of the lighting module 20.

For instance, FIG. 6 shows an example of a known protection circuit for a LED string.

In the example considered, the LED string comprises a plurality of LEDs, for example four LEDs $L_1$, $L_2$, $L_3$ and $L_4$, which can be connected to an electronic converter 10.

In the example considered, a respective protection diode is connected in antiparallel to each LED L, and consequently the protection circuit 30 comprises four diodes $D_{ESD1}$, $D_{ESD2}$, $D_{ESD3}$ and $D_{ESD4}$, such as for example Zener diodes.

In addition, a further diode $D_{ARB}$ may be provided, such as for example a Schottky diode, which is connected in series to the LED strings, for example between the positive terminal 106 of the converter 10 and the LED string, in such a way as to protect the LED string from reverse biasing.

Evidently, the aforesaid protection diodes add further costs and in the case where the LED strings are not protected mechanically, for example via a resin or silicone, a protection diode should be provided for each LED.

SUMMARY

Various embodiments provide a lighting system including a protection circuit having the characteristics recalled in the ensuing claims. The claims also refer to a corresponding method for protecting light sources from electrostatic discharges.

In general, the solution described herein can be applied to a string of light sources, such as for example LEDs or other solid-state lighting means, which are connected in series between a first terminal, typically the positive terminal, and a second terminal, which typically represents ground.

In various embodiments, at least one electrical contact of the string is not protected mechanically and is consequently accessible.

Consequently, in various embodiments a protection circuit is provided for protecting the light sources from an electrostatic discharge that can be applied to the aforesaid electrical contact.

In various embodiments, the protection circuit includes for this purpose one or more TVS diodes or sets of antiparallel diodes that are connected to the second terminal, i.e., to ground. In general, just a single TVS diode or set of antiparallel diodes may also be provided for all the electrical contacts.

In various embodiments, associated to each electrical contact that is accessible is a respective capacitor, which is connected between the respective electrical contact and one of the TVS diodes or sets of antiparallel diodes.

Consequently, in various embodiments, a possible electrostatic event applied to an electrical contact is discharged through the respective capacitor and the respective TVS diode or set of antiparallel diodes towards the second terminal, i.e., ground.

For instance, in various embodiments, none of the electrical contacts between the light sources is protected and consequently associated to each light source is a respective capacitor. Likewise, the string may also comprise additional components, such as for example a current regulator connected in series to the light sources. In this case, it may also be envisaged that a further capacitor is associated to each additional component.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the ensuing description, various specific details are illustrated aimed at providing an in-depth understanding of the embodiments. The embodiments may be obtained without one or more of the specific details, or with other methods, components, materials, etc. In other cases, known structures, materials, or operations are not illustrated or described in detail so that various aspects of the embodiments will not be obscured.

The reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in various points of the present description do not necessarily refer to one and the same embodiment. Furthermore, particular conformations, structures, or characteristics may be combined in any adequate way in one or more embodiments.

The references used herein are provided merely for convenience and hence do not define the sphere of protection or the scope of the embodiments.

As mentioned previously, the present disclosure provides solutions that enable protection of solid-state lighting means, such as for example LEDs, from electrostatic discharges, substantially eliminating the need for protection diodes, or at least reducing the number thereof.

Figure 7:
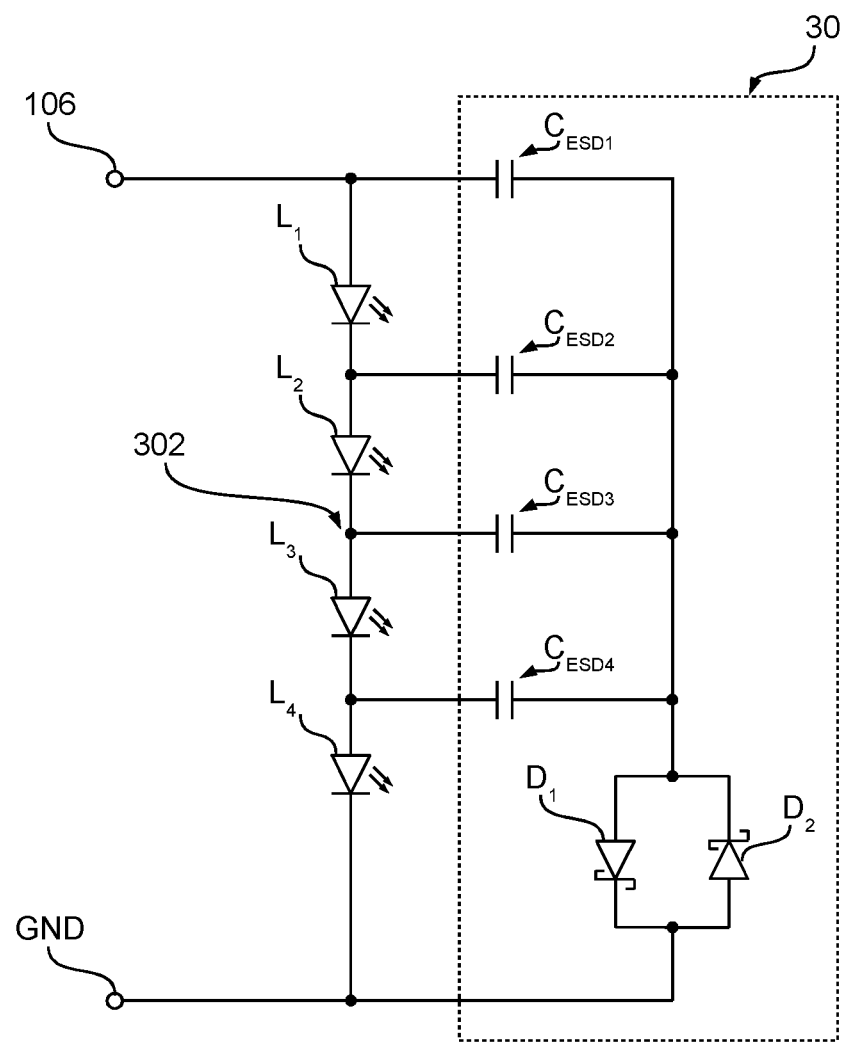
FIGS. 7 and 8 show protection circuits according to the present description.

FIG. 7 shows a possible embodiment of a protection circuit 30 according to the present description.

Figure 1:
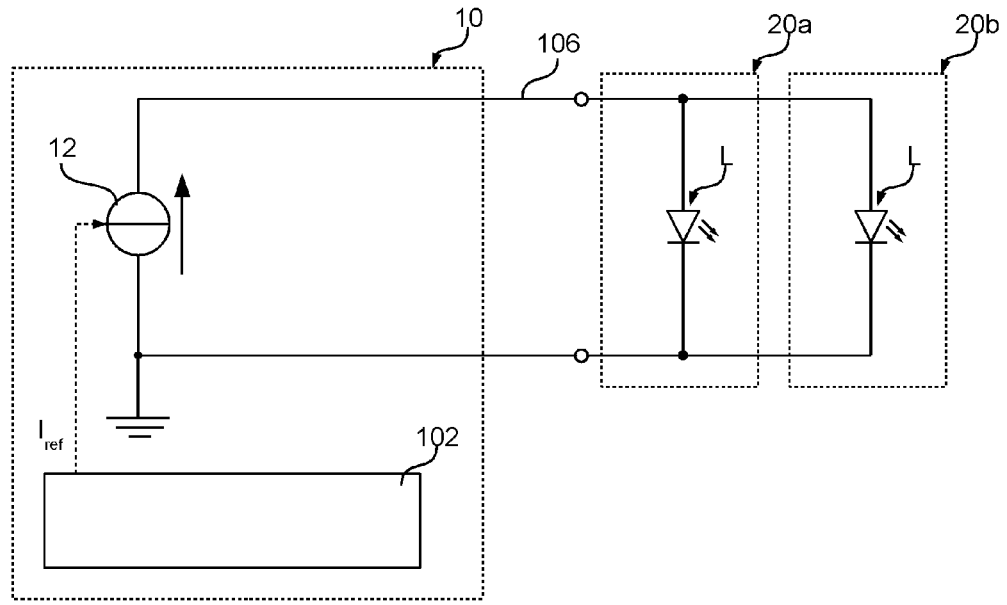
FIGS. 1 to 6 have already been described previously.
Figure 2:
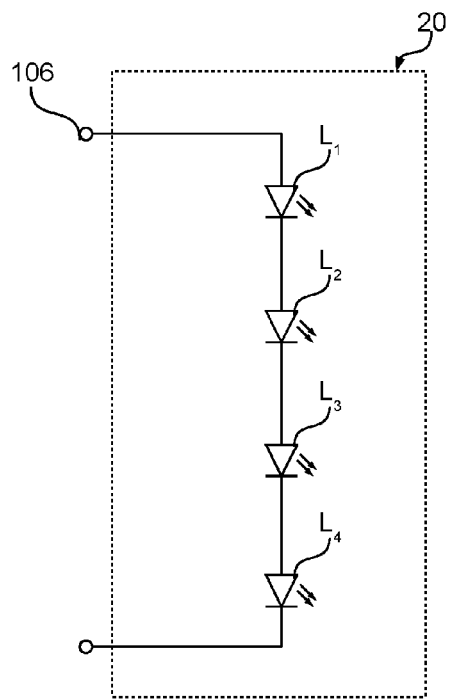
Figure 3:
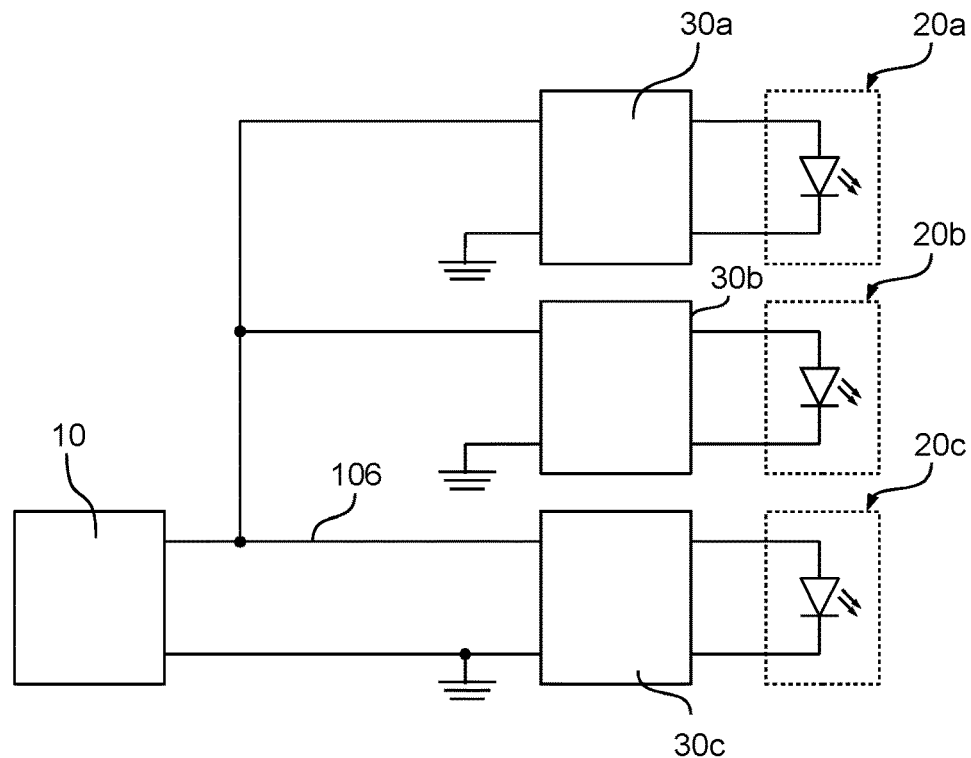
Figure 6:
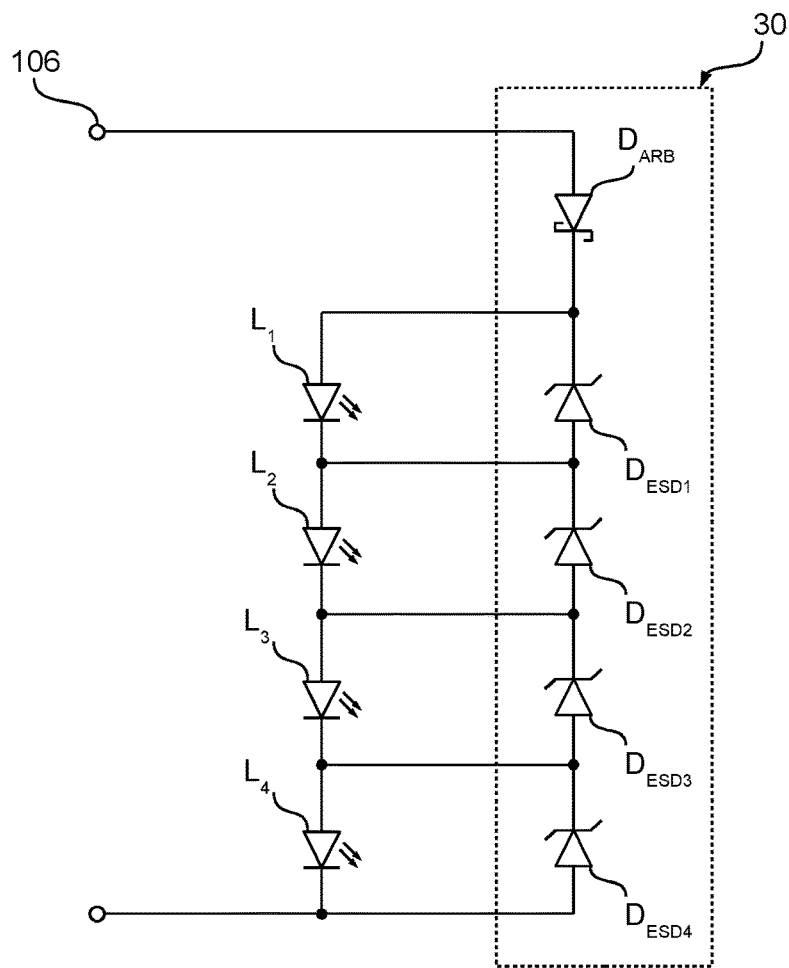

The general structure is substantially based upon the diagram illustrated in FIG. 6. Consequently, also in the embodiment considered, the lighting system includes at least one LED string including a plurality of LEDs (which can be distributed over one or more lighting modules connected in series) that can be connected to an electronic converter 10. Consequently, in general the solution described may be used also in the lighting systems described with reference to FIGS. 1, 3 and 4.

In the embodiment considered, at least two electrical contacts of the string are not protected mechanically. Consequently, these contacts are accessible and the respective circuit (in particular, the LEDs) should be protected from electrostatic discharges.

For instance, in the embodiment considered four LEDs $L_1$, $L_2$, $L_3$ and $L_4$ are illustrated, which are mounted on a printed circuit, such as for example a flexible printed circuit, without any mechanical protection. As a result, each LED should be protected from electrostatic discharges.

Consequently, also in this case a protection circuit 30 is provided. Basically, the protection circuit 30 according to the present description includes a plurality of capacitors in a Y configuration connected in series to a TVS diode or two antiparallel diodes, such as for example two Schottky diodes.

In particular, in the embodiment considered, the protection circuit 30 includes a number of capacitors that is equal to the number of the units that have to be protected. As mentioned previously, the above smallest units may be the individual LEDs of a LED string, or subset of LEDs or the entire lighting module. For instance, in the case provided by way of example of four LEDs without any mechanical protection, also four capacitors $C_{ESD1}$, $C_{ESD2}$, $C_{ESD3}$ and $C_{ESD4}$ are provided.

In various embodiments, the first terminal of each capacitor $C_{ESD1}$, $C_{ESD2}$, $C_{ESD3}$ and $C_{ESD4}$ is preferably directly connected to the anode of the respective LED, i.e., to the anode of the last LED if the respective unit includes a number of LEDs connected in series. Instead, the second terminals of the capacitors $C_{ESD1}$, $C_{ESD2}$, $C_{ESD3}$ and $C_{ESD4}$ are electrically connected together, preferably directly without other intermediate components.

In various embodiments, the above common point is connected to ground through a TVS diode or two antiparallel diodes $D_1$ and $D_2$, such as for example two low-voltage diodes. In general, a number of TVS diodes or sets of antiparallel diodes may also be provided, and the second terminal of each capacitor could be connected to one of said TVS diodes or sets of antiparallel diodes. For instance, each lighting module could include just one TVS diode or pair of antiparallel diodes $D_1$ and $D_2$ and the capacitors that are associated to the LEDs of the lighting module may all be connected to the aforesaid TVS diode or pair of antiparallel diodes.

Consequently, in the case of an electrostatic event in a given point, for example the point 302 between the LEDs $L_2$ and $L_3$ of FIG. 7, the current would be discharged first mainly in the capacitor $C_{ESD3}$ and subsequently through the TVS diode or the two antiparallel diodes $D_1$ and $D_2$. In particular, in the case where the electrostatic event were to correspond to a positive voltage, the current would be discharged through the diode $D_1$, and otherwise through the diode $D_2$. For this reason, the TVS diode or the diodes $D_1$ and $D_2$ should have a short activation time (typically less than 700 ps).

In general, the capacitance of the protection capacitors $C_{ESD1}$, $C_{ESD2}$, $C_{ESD3}$ and $C_{ESD4}$ should be appropriately sized. In fact, the capacitance should not be too low, because in this case the current could be discharged also through the adjacent LEDs. Instead, a high capacitance requires a lot of space and increases costs. For instance, in one embodiment, the protection capacitors $C_{ESD1}$, $C_{ESD2}$, $C_{ESD3}$ and $C_{ESD4}$ have a capacitance that is between 10 and 250 nF.

The solution proposed is also very robust against failure (as required by the CE declaration), because at least two components connected in series between the supply voltage 106 and ground GND are present.

Furthermore the protection circuit 30 is also robust against reverse biasing, because, in the case of direct current, the capacitors $C_{ESD}$ behave like an open circuit.

Finally, the protection circuit 30 proposed also enables a dimming operation through a low-frequency PWM as described in the introductory part of the present description.

Figure 4:
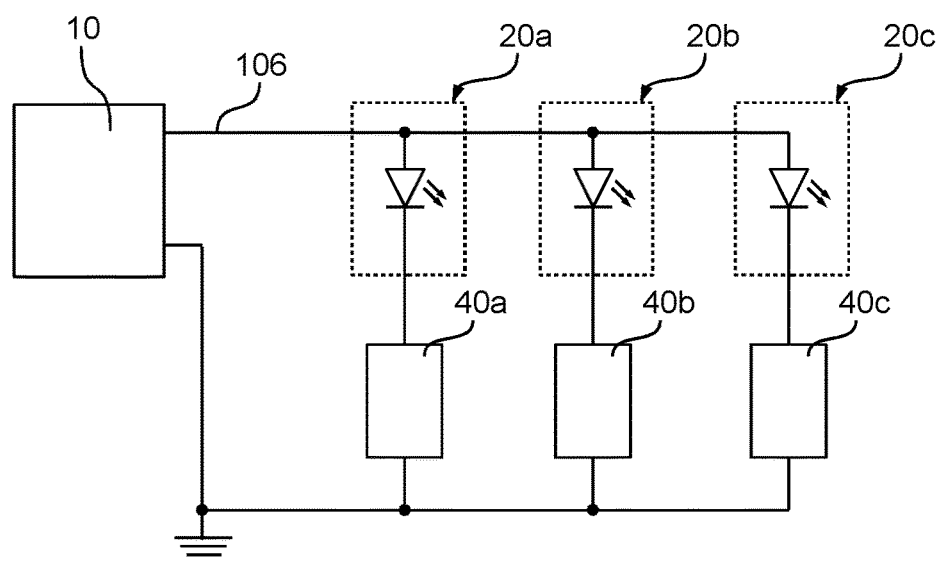
Figure 5:
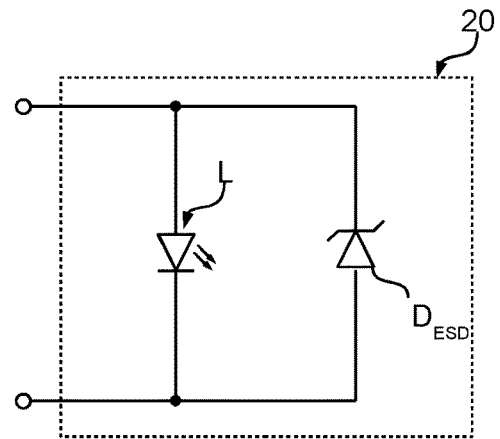
Figure 8:
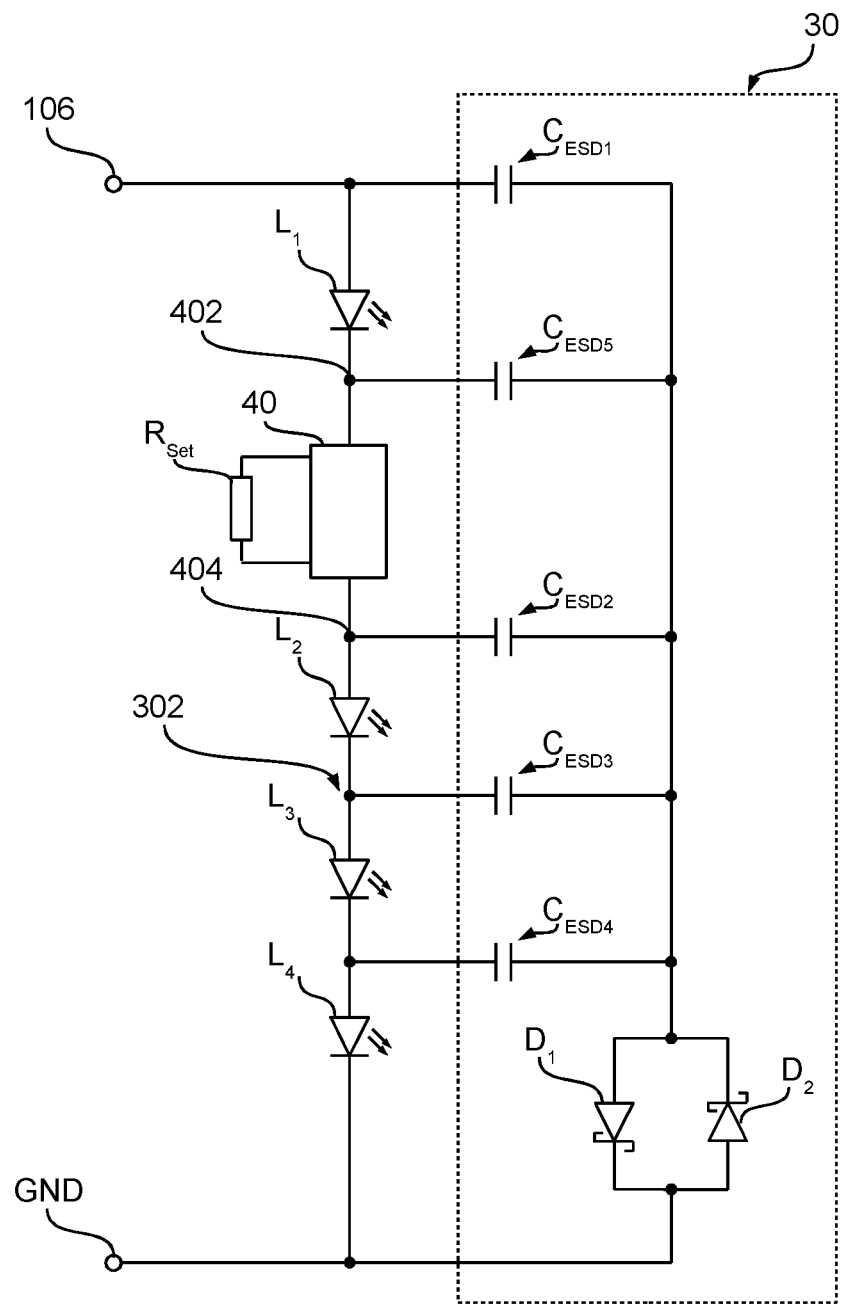

FIG. 8 shows a possible embodiment of a lighting module 20 that could be connected to an electronic converter 10 that generates a regulated voltage VDD on the line 106, as illustrated for example in FIG. 4.

In the embodiment considered, the lighting module 20 includes a LED string, including for example four LEDs $L_1$, $L_2$, $L_3$ and $L_4$, and a current regulator 40 connected in series to the LEDs, which limits the current that traverses the LED string. For instance, in the embodiment considered, the current regulator 40 is connected through two terminals 402 and 404 between the cathode of the LED $L_1$ and the anode of the LED $L_2$.

Furthermore, in the embodiment considered, the current regulator 40 has associated to it an identification element, such as for example a resistor $R_{set}$, which identifies the maximum current that can traverse the LED string.

Consequently, by applying the solution described previously to the aforesaid lighting module 20, the protection circuit 30 would include one capacitor $C_{ESD}$ for each set of LEDs that has contacts that are not protected. Hence, in the embodiment considered four capacitors $C_{ESD1}$, $C_{ESD2}$, $C_{ESD3}$ and $C_{ESD4}$ are required, in which the first terminal of each capacitor is connected to the anode of the respective LED L. Instead, the second terminals are connected through a TVS diode or two antiparallel diodes $D_1$ and $D_2$ to ground GND.

However, in this case, the cathode of the first LED $L_1$ would not be protected from electrostatic discharges. Consequently, in the case where also this terminal is accessible, it is sufficient to add a further capacitor $C_{ESD5}$ that connects the cathode to the TVS diode or the diodes $D_1$ and $D_2$.

Consequently, in general, each terminal of the LED string that is accessible (except for the terminal that represents ground GND) is connected through a protection capacitor to a TVS diode or two antiparallel diodes $D_1$ and $D_2$, which are in turn connected to ground GND or to the positive terminal 106.

Figure 9:
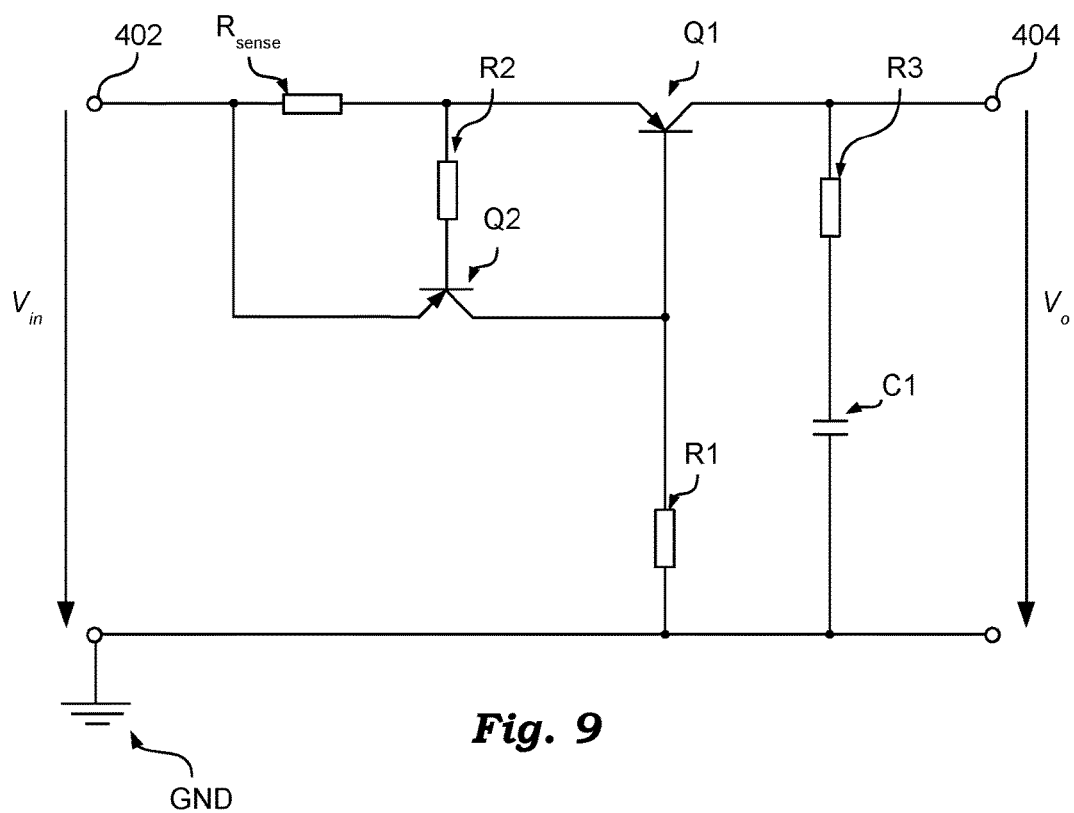
FIG. 9 shows a current regulator that can be used in the embodiment of FIG. 8.

Finally, FIG. 9 shows a possible embodiment of the current regulator.

In the embodiment considered, the current regulator 40 is configured for detecting the current $I_o$ that traverses the current regulator 40 and varying its electrical resistance as a function of the current $I_o$ detected in such a way that the aforesaid current will not exceed a maximum-current threshold $I_{max}$.

In the embodiment considered, the current regulator 40 receives a voltage $V_{in}$ through a terminal 402. In the embodiment considered, the positive terminal 402 is connected through a resistor $R_{sense}$ to the emitter of a first PNP bipolar-junction transistor Q1 and the collector of the first transistor Q1 is directly connected to the positive-output terminal 404.

In the embodiment considered, the positive terminal 402 is also directly connected to the emitter of a second PNP bipolar-junction transistor Q2, and the collector of the second PNP bipolar-junction transistor Q2 is connected through a resistor R1 to ground GND.

Finally, the base of the first transistor Q1 is directly connected to the collector of the second transistor Q2, and the base of the second transistor Q2 is connected either directly or, preferably, through a resistor R2 to the emitter of the first transistor Q1.

Basically, the resistor R1 enables activation of the transistor Q1, which gets a flow of current $I_o$ to pass towards the positive-output terminal 404.

When the current that traverses the resistor $R_{sense}$ exceeds a given threshold, i.e., when the voltage across the resistor $R_{sense}$ exceeds the threshold voltage of the transistor Q2, the transistor Q2 starts to conduct by partially deactivating the transistor Q1, which limits the flow of current through the transistor Q1.

The person skilled in the art will appreciate that the circuit 40 may also include other components, such as for example a resistor R3 and a capacitor C1 that stabilize the supply signal that is supplied through the output 404.

Furthermore, the person skilled in the art will appreciate that similar circuits for limiting a current, even circuits that use NPN bipolar-junction transistors or MOSFET transistors, are well known, which thus renders any further detailed description superfluous.

To sum up, in the embodiment considered, the value of the resistance $R_{sense}$ determines a voltage drop that, once the threshold voltage of the transistor Q2 has been exceeded, activates the transistor Q2. Consequently, the maximum current threshold can be set by means of the electrical resistance of the resistor $R_{sense}$, which can thus be used as identification element $R_{Set}$ that specifies the maximum current that can traverse the LED string.

Consequently, the solution described herein can be used for protecting a LED string L from an electrostatic discharge. In particular, in various embodiments, the LED string is connected between a positive terminal and a negative terminal that represents ground GND. In general, the solution could also be applied to other solid-state lighting means, such as for example laser diodes.

The protection circuit according to the present description includes at least one TVS diode or a pair of antiparallel diodes, and for each contact that is to be protected from an electrostatic discharge, for example the positive terminal and the terminals between the LEDs L that are accessible, a respective capacitor.

In particular, each terminal that is to be protected is connected through a respective capacitor and a TVS diode or pair of antiparallel diodes to ground GND, in such a way that a possible electrostatic event can be discharged towards ground GND through the respective capacitor $C_{ESD}$ and the TVS diode or pair of antiparallel diodes.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A lighting system comprising:
a first terminal and a second terminal;
a string of light sources connected in series between said first terminal and said second terminal; and
a protection circuit configured for protecting said light sources from an electrostatic discharge applied to at least one electrical contact of said string of light sources,
wherein said protection circuit comprises:
one set of antiparallel diodes connected to said second terminal; and
a respective capacitor connected between said at least one electrical contact and one set of antiparallel diodes, in such a way that an electrostatic event applied to an electrical contact is discharged through the respective capacitor and the set of antiparallel diodes towards said second terminal.

2. The system according to claim 1, wherein said protection circuit comprises a single set of antiparallel diodes for all electrical contacts.

3. The system according to claim 1, wherein said light sources are solid-state lighting sources.

4. The system according to claim 3, wherein said light sources are LEDs.

5. The system according to claim 1, wherein the electrical contacts between said light sources are not protected, and wherein associated to each light source is a respective capacitor.

6. The system according to claim 1, wherein said lighting system comprises a current regulator connected in series to said light sources, and wherein a further capacitor is associated to said current regulator.

7. The system according to claim 1, wherein said lighting system is configured in such a way that said first terminal is a positive terminal and said second terminal is a negative terminal.

8. The system according to claim 1, wherein said system is integrated in a lighting module.

9. The system according to claim 1, further comprising an electronic converter configured for supplying said string of light sources through said first terminal and said second terminal.

10. A method for protecting light sources of a string of light sources from electrostatic discharges applied to at least one electric contact of said string of light sources, wherein said light sources are connected in series between a first terminal and a second terminal,
the method comprising:
connecting one set of antiparallel diodes to said second terminal; and
connecting a capacitor between each of said at least one electrical contact and one set of antiparallel diodes, in such a way that an electrostatic event applied to an electrical contact is discharged through the respective capacitor and the set of antiparallel diodes towards said second terminal.

* * * * *

UNITED STATES PATENT AND TRADEMARK OFFICE
CERTIFICATE OF CORRECTION

PATENT NO. : 10,455,662 B2
APPLICATION NO. : 15/116228
DATED : October 22, 2019
INVENTOR(S) : Alessio Griffoni et al.

Page 1 of 1

It is certified that error appears in the above-identified patent and that said Letters Patent is hereby corrected as shown below:

In the Claims

Column 8, Line 2, Claim 1, change 'one' to -- at least one transient-voltage suppression (TVS) diode or --.

Column 8, Line 5, Claim 1, change 'one' to -- one of said at least one TVS diode or --.

Column 8, Line 8, Claim 1, change 'the' to -- the respective TVS diode or --.

Column 8, Line 11, Claim 2, change 'single' to -- single TVS diode or --.

Column 8, Line 41, (approx.), Claim 10, change 'one' to -- at least one TVS diode or --.

Column 8, Line 44, (approx.), Claim 10, change 'one' to -- one of said at least one TVS diode --.

Column 8, Line 47, (approx.), Claim 10, change 'the' to -- the respective TVS diode or --.

Signed and Sealed this
Eighteenth Day of February, 2020

Andrei Iancu
*Director of the United States Patent and Trademark Office*